US012609143B2

(12) United States Patent      (10) Patent No.:    US 12,609,143 B2

Vankayala        (45) Date of Patent:    *Apr. 21, 2026

(54) READ OPERATIONS FOR A MEMORY ARRAY AND REGISTER

(71) Applicant: Micron Technology, Inc., Boise, ID (US)

(72) Inventor: Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 163 days.

This patent is subject to a terminal disclaimer.

(21) Appl. No.: 18/416,770

(22) Filed: Jan. 18, 2024

(65) Prior Publication Data

US 2024/0242746 A1     Jul. 18, 2024

Related U.S. Application Data

(63) Continuation of application No. 17/652,233, filed on Feb. 23, 2022, now Pat. No. 11,887,687.

(51) Int. Cl.
*G11C 7/10*      (2006.01)

(52) U.S. Cl.
CPC .......... *G11C 7/1039* (2013.01); *G11C 7/1012* (2013.01); *G11C 7/1063* (2013.01); *G11C 7/1066* (2013.01); *G11C 7/109* (2013.01); *G11C 7/1093* (2013.01)

(58) Field of Classification Search
CPC ... G11C 7/1039; G11C 7/1012; G11C 7/1063; G11C 7/1066; G11C 7/109; G11C 7/1093

USPC ...................................................... 365/189.05
See application file for complete search history.

(56) References Cited

U.S. PATENT DOCUMENTS

| | | | |
|---|---|---|---|
| 5,008,886 A | 4/1991 | Chinnaswamy et al. | |
| 5,224,070 A | 6/1993 | Fandrich et al. | |
| 5,822,245 A | 10/1998 | Gupta et al. | |
| 5,937,423 A | 8/1999 | Robinson | |
| 5,974,499 A | 10/1999 | Norman et al. | |
| 6,445,624 B1 * | 9/2002 | Janzen ................ | G06F 13/1689 |
| | | | 365/233.17 |
| 11,074,949 B2 * | 7/2021 | Mirichigni ........... | G11C 7/1087 |
| 11,307,771 B2 * | 4/2022 | Tatapudi .............. | G11C 29/028 |
| 11,631,442 B1 * | 4/2023 | Cho .......................... | G11C 7/22 |
| | | | 365/230.06 |
| 2002/0004878 A1 | 1/2002 | Norman | |
| 2008/0016279 A1 | 1/2008 | Clark et al. | |
| 2016/0034346 A1 | 2/2016 | Michael | |
| 2020/0118609 A1 * | 4/2020 | Brox .................... | G11C 29/021 |

* cited by examiner

*Primary Examiner* — Ly D Pham
(74) *Attorney, Agent, or Firm* — Holland & Hart LLP

(57) ABSTRACT

Methods, systems, and devices for read operations for a memory array and register are described. In some examples, a memory device may include one or more memory arrays and one or more registers (e.g., one or more mode registers). The memory device may include circuitry that allows for a command to access a memory array and a command to access a register to be received consecutively (e.g., during consecutive sets of clock cycles). Because the commands may be received during consecutive sets of clock cycles, the corresponding data may also be output from the memory array and register during consecutive clock cycles.

20 Claims, 7 Drawing Sheets

625

630

620

600

Figure 7:
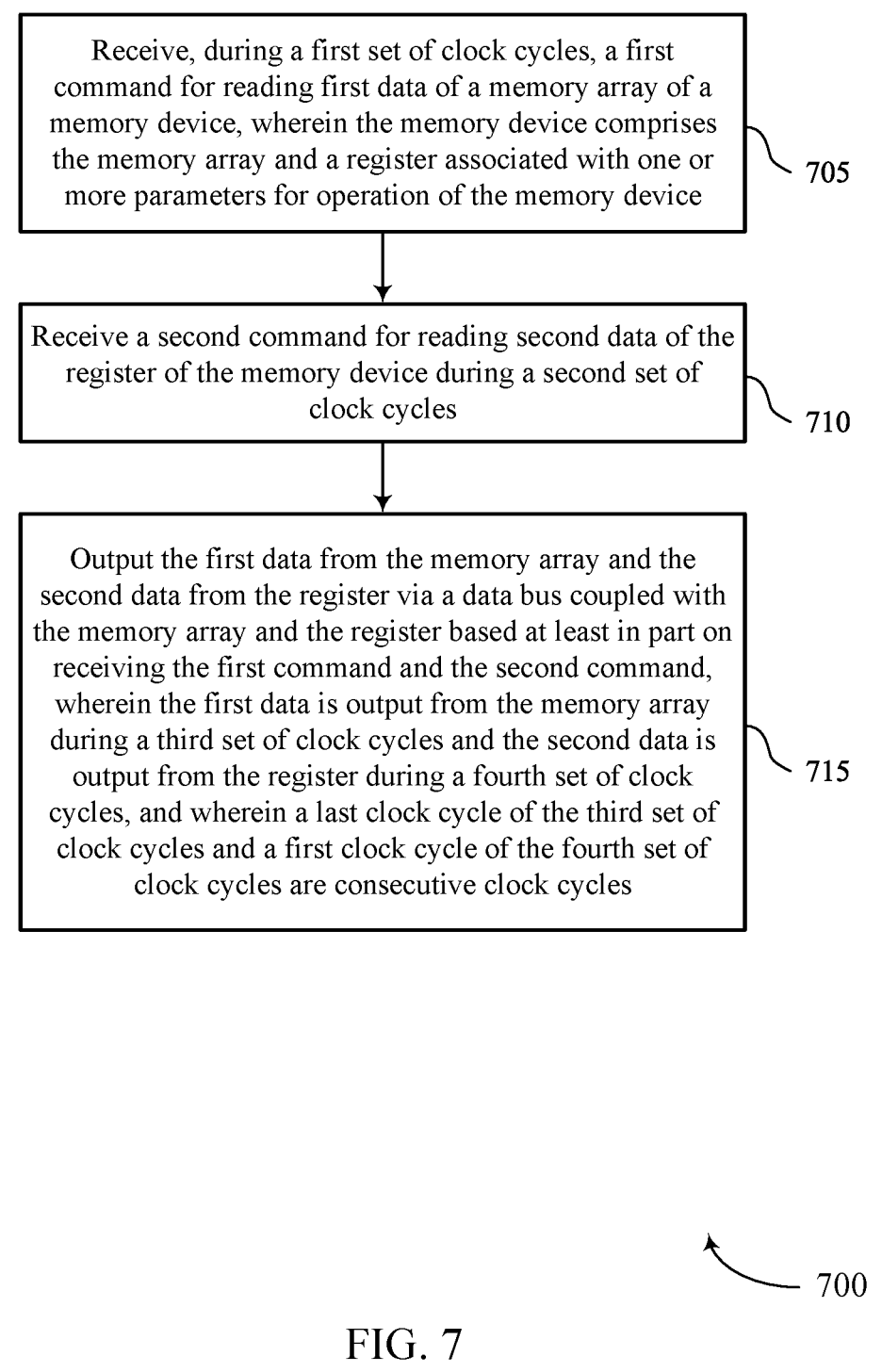

Receive, during a first set of clock cycles, a first command for reading first data of a memory array of a memory device, wherein the memory device comprises the memory array and a register associated with one or more parameters for operation of the memory device

↘ 705

Receive a second command for reading second data of the register of the memory device during a second set of clock cycles

↘ 710

Output the first data from the memory array and the second data from the register via a data bus coupled with the memory array and the register based at least in part on receiving the first command and the second command, wherein the first data is output from the memory array during a third set of clock cycles and the second data is output from the register during a fourth set of clock cycles, and wherein a last clock cycle of the third set of clock cycles and a first clock cycle of the fourth set of clock cycles are consecutive clock cycles

READ OPERATIONS FOR A MEMORY ARRAY AND REGISTER

CROSS REFERENCE

The present Application for Patent is a continuation of U.S. patent application Ser. No. 17/652,233 by Vankayala et al., entitled "READ OPERATIONS FOR A MEMORY ARRAY AND REGISTER," filed Feb. 23, 2022, assigned to the assignee hereof, and is expressly incorporated by reference in its entirety herein.

FIELD OF TECHNOLOGY

The following relates to one or more systems for memory, including read operations for a memory array and register.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIG. 7 shows a flowchart illustrating a method or methods that support read operations for a memory array and register in accordance with examples as disclosed herein.

DETAILED DESCRIPTION

Figure 1:
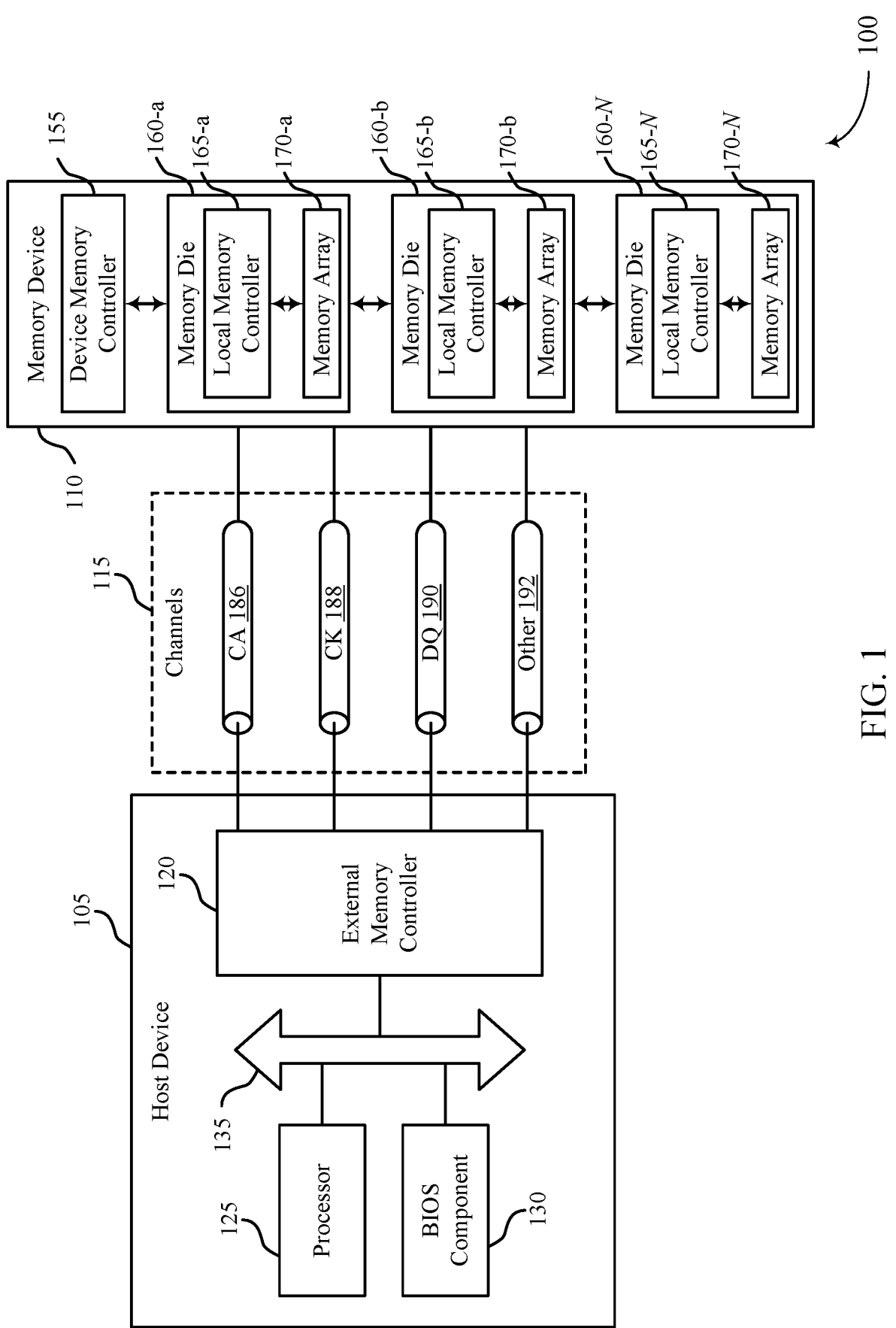
FIG. 1 illustrates an example of a system that supports read operations for a memory array and register in accordance with examples as disclosed herein.

A memory device may include, among other components, one or more memory arrays (e.g., one or more arrays of memory cells) and one or more registers (e.g., one or more mode registers). Data may be read from or written to the memory array based on commands received from a host system whereas the registers may store data that is used manage and control settings of the memory device. In some instances, the memory device may receive commands (e.g., via a command/address (CA) channel) to access both the memory array and one or more registers. Upon receiving the commands, the memory device may sequentially output array data and register data (e.g., via a data (DQ) channel).

Some memory specifications (e.g., a DRAM specification) may require a certain duration (e.g., a certain quantity of clock cycles) to occur between receiving the commands to access the memory array and the registers. Moreover, the memory device may experience a latency between receiving a command and outputting the corresponding data. For example, a first latency may occur between receiving a command to access the memory array and outputting the corresponding data, and a second latency may occur between receiving a command to access a register and outputting the corresponding data. Due to the duration between receiving the commands and the latencies associated with the commands, the DQ channel may experience empty cycles, which may reduce the system's overall performance. Accordingly, a memory device configured to receive consecutive commands for reading array data and register data may be desirable.

A memory device configured to receive consecutive commands for reading array data and register data is described herein. In some examples, the memory device may include circuitry that allows for a command to access a memory array and a command to access a register of the memory device to be received consecutively (e.g., during consecutive sets of clock cycles). For example, a first command for reading first data of a memory array may be received during a first set of clock cycles and a second command for reading second data of a register may be received during a second set of clock cycles that follows (e.g., is sequentially consecutive with) the first set of clock cycles. Because the commands may be received during consecutive sets of clock cycles, the corresponding data may also be output from the memory array and register during consecutive clock cycles. Accordingly, fewer (or no) empty cycles may be introduced on the DQ channel, which may improve the memory device's overall performance.

Features of the disclosure are initially described in the context of systems and dies as described with reference to FIGS. 1 and 2. Features of the disclosure are described in the context of a timing diagram, a circuit, and a process flow diagram as described with reference to FIGS. 3-5. These and other features of the disclosure are further illustrated by and described with reference to an apparatus diagram and flowcharts that relate to read operations for a memory array and register as described with reference to FIGS. 6 and 7.

FIG. 1 illustrates an example of a system 100 that supports read operations for a memory array and register in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal). The channels 115 may be single-ended or differential signaling may be used with signal pairs for each channel 115.

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110. As described herein, the data channels 190 may be operable to communicate array data (e.g., data written to or read from a memory array 170) and register data (e.g., data read from or written to one or more registers of the memory device 110). In some examples, the array data and register data may be communicated, via the data channels 190, during consecutive sets of clock cycles.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the memory device 110 may include one or more registers (e.g., mode registers or other types of registers that are not shown) for storing data to manage or control settings of the memory device 110. The memory device 110 may receive commands to read the registers, via the CA channels 186, and may output data via the DQ channels 190. Similarly, the memory device 110 may receive commands to read data from one or more memory arrays 170, via the CA channels 186, and may output associated data via the DQ channels 190.

The memory device 110 may include circuitry (not shown) that allows for register read commands and array read commands to be received (e.g., via the CA channels 186) during consecutive sets of clock cycles (e.g., one or more cycles of the clock signal received via the clock signal channels 188). Accordingly, the respective data may be output (e.g., via the DQ channels 190) during consecutive sets of clock cycles, which may reduce (or eliminate) the quantity of empty clock cycles on the DQ channels 190. Reducing or eliminating the quantity of empty clock cycles on the DQ channels 190 may improve the overall performance of the memory device 110.

Figure 2:
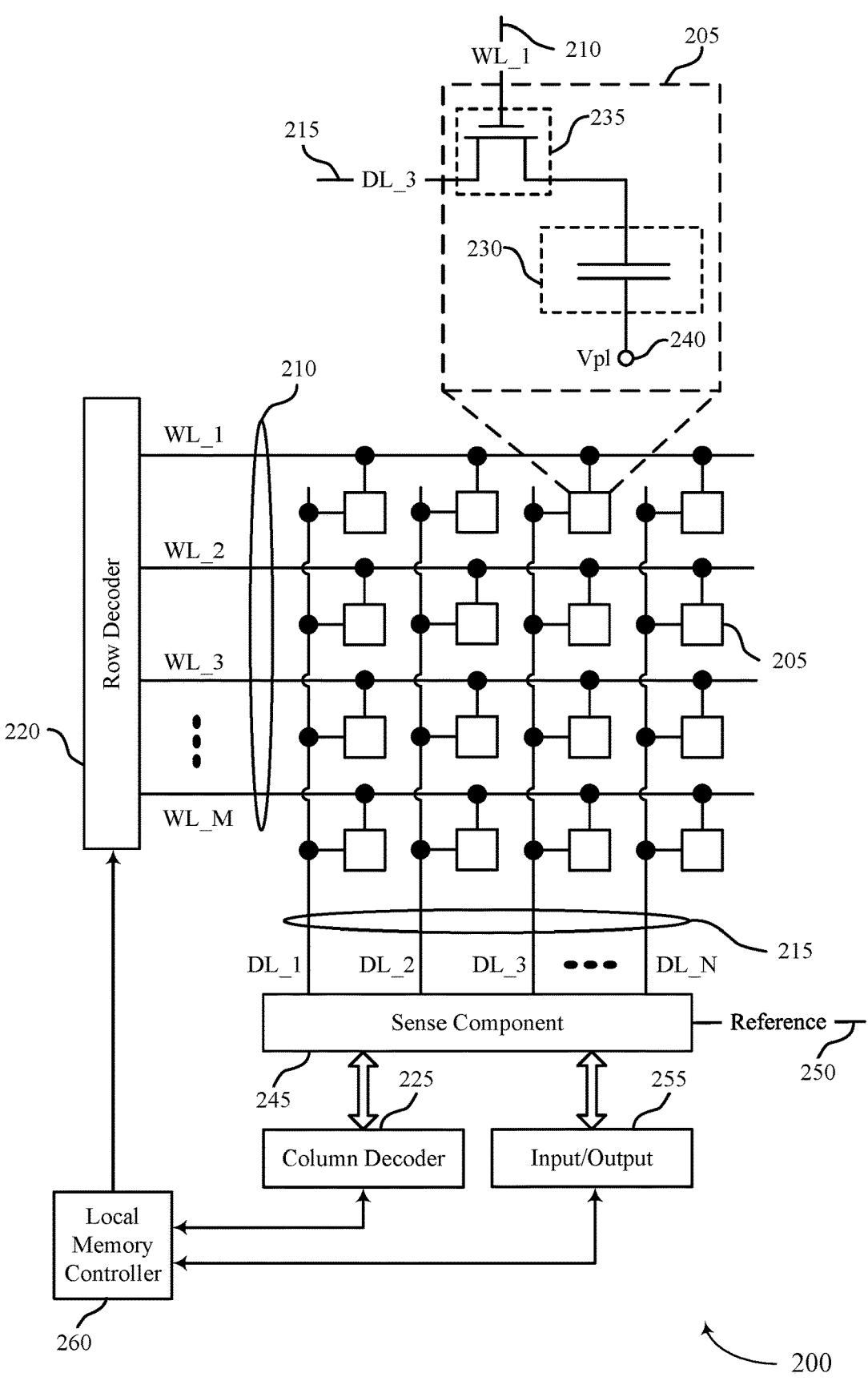
FIG. 2 illustrates an example of a memory die that supports read operations for a memory array and register in accordance with examples as disclosed herein.

FIG. 2 illustrates an example of a memory die 200 that supports read operations for a memory array and register in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, a memory device associated with the memory die 200 may include one or more registers (e.g., mode registers or other types of registers that are not shown) for storing data to manage or control settings of the memory die 200. The memory device may receive commands to read the registers, via one or more CA channels (e.g., CA channels 186 as described with reference to FIG. 1), and may output data via one or more DQ channels (e.g., DQ channels 190 as described with reference to FIG. 1). Similarly, the memory device may receive commands to read data from the memory die 200 via the CA channels, and data may be output from the memory die 200 (e.g., from one or more memory cells 205 of the memory die 200) via the DQ channels.

The memory device may include circuitry (not shown) that allows for register read commands and array read commands to be received (e.g., via the CA channels) during consecutive sets of clock cycles. Accordingly, the respective data may be output (e.g., via the DQ channels) during consecutive sets of clock cycles, which may reduce (or eliminate) the quantity of empty clock cycles on the DQ channels. Reducing or eliminating the quantity of empty clock cycles on the DQ channels may improve the overall performance of the memory device associated with the memory die 200.

Figure 3:
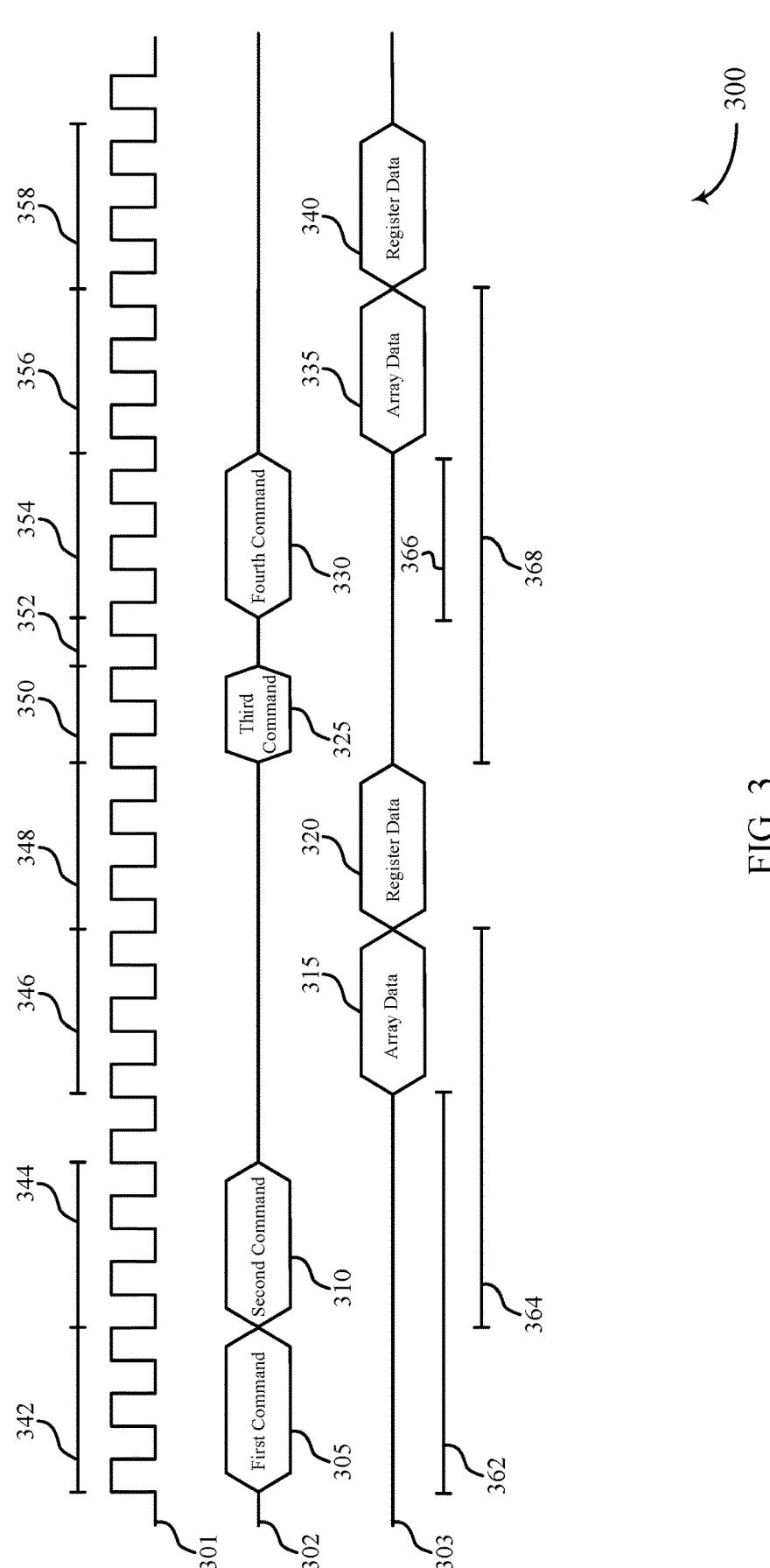
FIG. 3 illustrates an example of a timing diagram that supports read operations for a memory array and register in accordance with examples as disclosed herein.

FIG. 3 illustrates an example of a timing diagram 300 that supports read operations for a memory array and register in accordance with examples as disclosed herein. The timing diagram 300 may illustrate a clock signal 301, a CA channel 302, and a DQ channel 303. In some examples, the CA channel 302 and the DQ channel 303 may be examples of the CA channel 186 and the DQ channel 190, respectively, as described with reference to FIG. 1. Moreover, the timing diagram 300 may illustrate commands received via the CA channel 302 and corresponding data output on the DQ channel 303. As described herein, the commands may be for reading array data and register data of a memory device and may be received during consecutive sets of clock cycles. By receiving commands during consecutive clock cycles, the corresponding data may also be output during consecutive clock cycles which may reduce or eliminate the quantity of empty clock cycles on the DQ channel 303, which may improve the overall performance of the associated memory device.

In some examples, the clock signal 301 may represent one or more clock signals communicated between a host device (e.g., a host device 105 as described with reference to FIG. For example, the clock signal 301 may be operable to oscillate between a high state and a low state, which may be referred to as a clock cycle (e.g., a single clock cycle). That is, a command may be received by a memory device (e.g., via the CA channel 302) during one or more clock cycles.

A set of clock cycles, as used herein, may refer to more than one clock cycle during which a command may be received. The quantity of clock cycles in a set of clock cycles during which a command is received may vary based on a variety of factors, such as a type of the command received. Additionally or alternatively, the clock signal 301 may support coordination (e.g., in time) between actions of the host device and the memory device. In some examples, the clock signal may provide a timing reference for command and addressing operations for the memory device, or other system-wide operations for the memory device.

The CA channel 302 may be dedicated for receiving commands (e.g., at a memory device) from a host device. In some examples, commands to read data from a memory array of the associated memory device may be received via the CA channel 302. Commands to read data from a register (e.g., a mode register) of the associated memory device may also be received by the CA channel 302. As described herein, a command to read data from a memory array and a command to read data from a register may be received in consecutive sets of clock cycles, which may improve the overall performance of the associated memory device.

In response to receiving a command via the CA channel 302, a memory device may output data from the DQ channel 303. For example, in response to receiving a command to read data from a memory array, the memory device may output the data from the memory array via the DQ channel 303. Additionally or alternatively, in response to receiving a command to read data from a register, the memory device may output the data from the register via the DQ channel 303. In some instances, data from a register or from a memory array may be output to a host device via the DQ channel 303.

In a first example, a memory device may receive a first command 305 via the CA channel 302. The first command 305 may be a read command for data stored to a memory array of the memory device and may be received during a first set of clock cycles 342. The first set of clock cycles 342 may represent any quantity of clock cycles. After receiving the first command 305, the memory device may receive a second command 310 via the CA channel 302. The second command 310 may be a read command for data stored to a register of the memory device and may be received during a second set of clock cycles 344. The second set of clock cycles 344 may represent any quantity of clock cycles and may include a same or a different quantity of clock cycles as the first set of clock cycles 342. Moreover, a last clock cycle of the first set of clock cycles 342 and a first clock cycle of the second set of clock cycles 344 may be consecutive clock cycles. That is, the first command 305 and the second command 310 may be received consecutively via the CA channel 302.

In response to receiving the first command 305, the memory device may read data from the memory array and may output the array data 315 via the DQ channel 303 during a third set of clock cycles 346. The third set of clock cycles 346 may represent any quantity of clock cycles and may include a same quantity of clock cycles as the first set of clock cycles 342. The memory device may incorporate latency, such as latency 362 (e.g., a duration 362) between receiving the first command 305 and outputting the array data 315. The latency 362 may represent the duration for the memory device to process the first command 305, read the data, and output the data to the DQ channel 303.

Moreover, in response to receiving the second command 310, the memory device may read data from the register and may output the register data 320 via the DQ channel 303 during a fourth set of clock cycles 348. The fourth set of clock cycles 348 may represent any quantity of clock cycles and may include a same quantity of clock cycles as the second set of clock cycles 344. The memory device may incorporate latency, such as latency 364 (e.g., a duration 364) between receiving the second command 310 and outputting the register data 320. The latency 364 may represent the duration for the memory device to process the second command 310, read the data, and output the data to the DQ channel 303. In some instances, the latency 364 may be greater than, less than, or equal to the latency 362.

In some cases, the memory device may be configured to receive the first command 305 and the second command 310 during consecutive sets of clock cycles, and may also be configured to output the array data 315 and the register data 320 during consecutive sets of clock cycles. For example, a quantity of clock cycles in the first set of clock cycles 342 and the third set of clock cycles 346 may be the same, and the latency 362 may equal the latency 364. That is, a last clock cycle of the third set of clock cycles 346 and a first clock cycle of the fourth set of clock cycles 348 may be consecutive clock cycles.

Moreover, since the array data 315 and the register data 320 may be output during consecutive sets of clock cycles, the DQ channel 303 may experience fewer (or no) empty cycles. For example, if a duration occurred between receiving the first command 305 and the second command 310, a same or similar duration (e.g., one or more empty cycles) would have occurred between outputting the array data 315 and the register data 320 but for the presence of the circuitry described herein, which may have negatively affected the memory device's performance. Accordingly, by receiving commands in consecutive sets of clock cycles, and subsequently outputting associated data in consecutive clock cycles, the memory device's overall performance may be improved.

In a second example, a memory device may receive a third command 325 via the CA channel 302. The third command 325 may be a read command for data stored to a register of the memory device and may be received during a fifth set of clock cycles 350. The fifth set of clock cycles 350 may represent any quantity of clock cycles. After receiving the third command 325, the memory device may receive a fourth command 330 via the CA channel 302. The fourth command 330 may be a read command for data stored to a memory array of the memory device and may be received during a seventh set of clock cycles 354. That is, a sixth set of clock cycles 352 may occur between receiving the third command 325 and receiving the fourth command 330. The sixth set of clock cycles 352 and the seventh set of clock cycles 354 may each represent any quantity of clock cycles and may include a same or a different quantity of clock cycles as the fifth set of clock cycles 350.

In response to receiving the fourth command 330, the memory device may read data from the memory array and may output the array data 335 via the DQ channel 303 during an eighth set of clock cycles 356. The eighth set of clock cycles 356 may represent any quantity of clock cycles and may include a same quantity of clock cycles as the seventh set of clock cycles 354. The memory device may incorporate latency, such as latency 366 (e.g., a duration 366) between receiving the fourth command 330 and outputting the array data 335. The latency 366 may represent the duration for the memory device to process the fourth command 330, read the data, and output the data to the DQ channel 303.

Moreover, in response to receiving the third command 325, the memory device may read data from the register and may output the register data 340 via the DQ channel 303 during a ninth set of clock cycles 358. The ninth set of clock cycles 358 may represent a quantity of clock cycles equal to the fifth set of clock cycles 350 and the sixth set of clock cycles 352. The memory device may incorporate latency, such as latency 368 (e.g., a duration 368) between receiving the third command 325 and outputting the register data 340. The latency 368 may represent the duration for the memory device to process the third command 325, process the fourth command 330, read the corresponding data, and output the corresponding data to the DQ channel 303. In some instances, the latency 368 may be greater than the latency 366.

Despite the memory device not receiving the third command 325 and the fourth command 330 during consecutive sets of clock cycles, the memory device may be configured to output the array data 335 and the register data 340 during consecutive sets of clock cycles. That is, a last clock cycle of the eighth set of clock cycles 356 and a first clock cycle of the ninth set of clock cycles 358 may be consecutive clock cycles.

Moreover, since the array data 335 and the register data 340 may be output during consecutive sets of clock cycles, the DQ channel 303 may experience fewer (or no) empty cycles. That is, but for the presence of the circuitry described herein, the sixth set of clock cycles 352 between receiving the third command 325 and the fourth command 330 may have resulted in a same or similar duration (e.g., one or more empty cycles) occurring between outputting the array data 335 and the register data 340. Such an empty cycle (or empty cycles) may have negatively affected the memory device's performance. Accordingly, by receiving commands in consecutive sets of clock cycles, and subsequently outputting associated data in consecutive clock cycles, the memory device's overall performance may be improved. Although the second example illustrates an instance where the third command 325 for reading the register is received prior to receiving the fourth command 330 to read the array data, in some cases the memory device may receive the third command 325 subsequent to the fourth command 330 and output the array data 335 and the register data 340 consecutively (e.g., where the latency 368 may be less than the latency 366).

Figure 4:
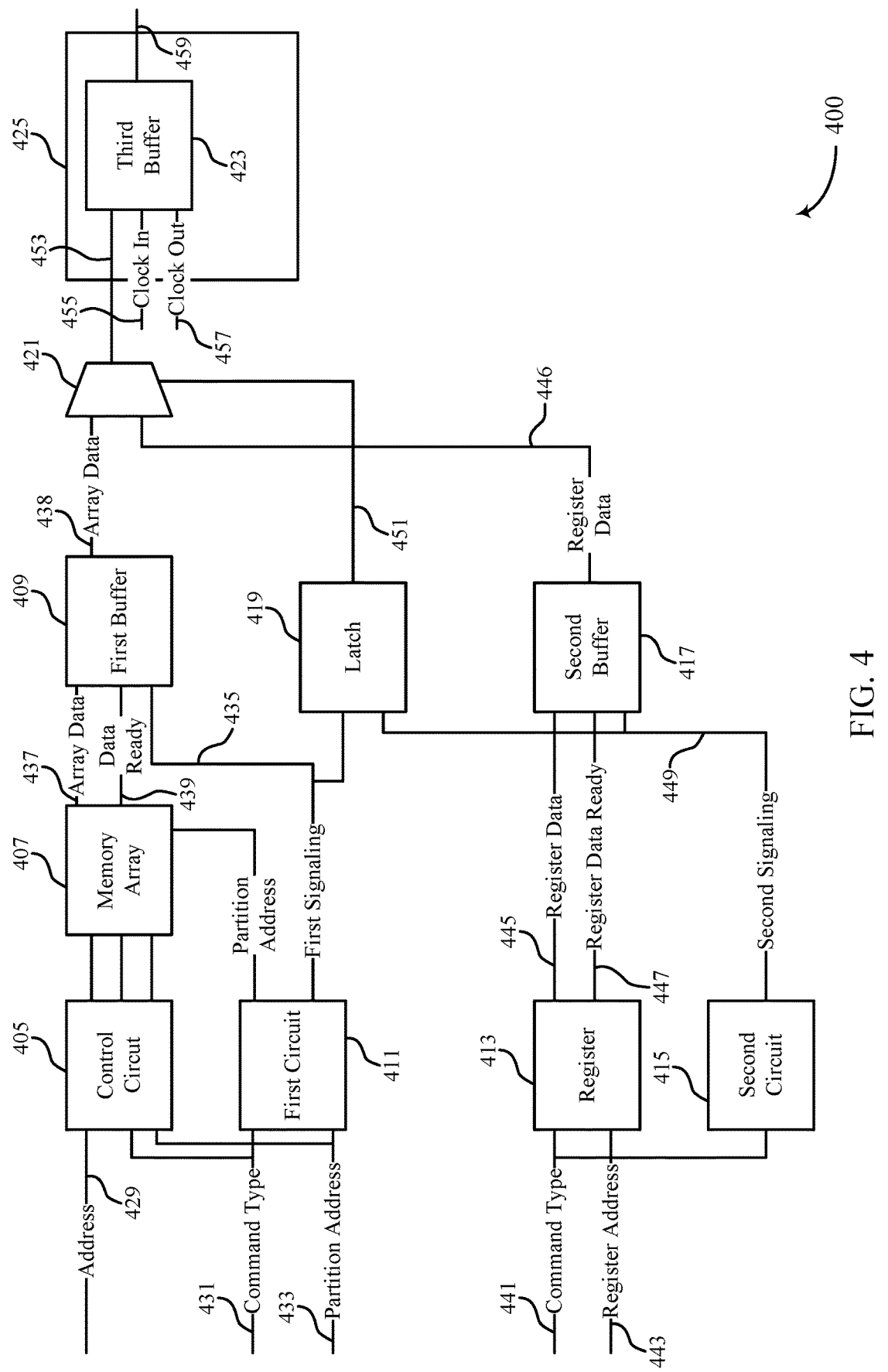
FIG. 4 illustrates an example of a circuit that supports read operations for a memory array and register in accordance with examples as disclosed herein.

FIG. 4 illustrates an example of a circuit 400 that supports read operations for a memory array and register in accordance with examples as disclosed herein. The circuit 400 may be coupled with the CA channel 302 and the DQ channel 303 as described with reference to FIG. 3 and may support receiving commands for reading array data and register data of a memory device and outputting associated data during consecutive clock cycles.

In some examples, the circuit 400 may include a control circuit 405, a first circuit 411, a memory array 407, and a first buffer 409, which may be associated with read commands for data stored to the memory array 407 (e.g., read commands associated with array data). The circuit 400 may also include registers 413, a second circuit 415, and a second buffer 417, which may be associated with read commands for data stored to the registers 413 (e.g., register read commands). In some examples, the circuit 400 may include a latch 419, a multiplexer 421, and a third buffer 423, which may be coupled with a DQ channel 427. As described herein, commands for reading array data and register data of a memory device may be received during consecutive sets of clock cycles or corresponding data may be output during consecutive clock cycles which may reduce or eliminate the quantity of empty clock cycles on the DQ channel 427, which may improve the overall performance of the associated memory device.

The circuit 400 may include a control circuit 405 that may receive an address 429, an indication of a type of command 431, and a partition address 433. For example, the partition address 433 may indicate a bank or portion of the memory array 407 that the command is associated with, and the address 429 may indicate a specific row and column of the memory array 407 to access. Additionally or alternatively, the type of command 431 may indicate a type of the command received, which may be a read command. The type of command may indicate whether to read array data (e.g., data from the memory array 407) or register data (e.g., data from the registers 413). The control circuit 405 may output each of the address 429, the indication of the type of command 431, and the partition address 433 to the memory array 407. In some examples, the control circuit 405 may perform address decoding or generation of other signals for accessing memory array 407 according to the commands.

In some examples, the circuit 400 may include a first circuit 411, which may be referred to as a read shifter 411. The first circuit 411 may receive the type of command 431 (e.g., an indication that a command is a read command) and the partition address 433. In some examples, the first circuit 411 may output the partition address 433 and first signaling 435, which may indicate that data from the memory array 407 is ready to be read out. The first circuit 411 and the first signaling 435 may ensure that array data output from the circuit 400 is clocked correctly based on a latency (e.g., a first latency) between the associated memory device receiving a command and data being output from the memory array. For example, the data may be output from the circuit 400 at a same or a different frequency, but shifted in phase based on the first signaling 435. In some examples, the first signaling 435 may also be provided to a latch 419.

The circuit 400 may include a memory array 407, which may receive the address 429 and the type of command 431 from the control circuit 405. The memory array 407 may include a plurality of memory cells, such as volatile memory cells or non-volatile memory cells. In some examples, the memory array 407 may receive the partition address 433 from the control circuit 405, from the first circuit 411, or from both (e.g., for redundancy or error detection purposes). Based on receiving the address 429, the type of command 431, and the partition address 433, array data 437 may be output from (e.g., read from) the memory array 407. The memory array 407 may also output signaling 439 indicating that the array data is ready.

In some examples, the circuit 400 may include a first buffer 409, which may be a FIFO buffer 409. The first buffer 409 may be configured to receive the array data 437, as well as the first signaling 435 (e.g., the signaling from the first circuit 411) and the signaling 439 from the memory array 407. In some examples, the signaling 439 may be an input clock signal for the first buffer 409 and the first signaling 435 may be an output clock signal for the first buffer 409. For example, the first signaling 435 may be activated (e.g., may have one or more clock pulses) a quantity of clock cycles after receiving the command 431 to read memory array 407, which may represent latency for output of data from the memory array to first buffer 409. Accordingly, the first buffer 409 may output the array data 437, which may be shifted based on the first signaling 435.

As described herein, the first buffer 409 may be a FIFO buffer 409 where the oldest entry (e.g., the first entry) is processed first and the newest entry (e.g., the last entry) is processed last. Moreover, the first buffer 409 may be associated with a first queue depth and thus may store a quantity (e.g., a first quantity) of data bursts during a duration. In some examples, the first buffer 409 may output the buffered array data 438, which may be received by a multiplexer 421 (e.g., as an input to the multiplexer 421).

The circuit 400 may include registers 413. In some examples the registers 413, which may include mode registers or other types of register, may store data associated with parameters for operating the associated memory device. The registers 413 may receive an indication of a type of command 441 and a register address 443. For example, the register address 443 may indicate a portion of the registers 413 to access, and the type of command 441 may indicate a type of the command received, which may be a read command. The type of command may indicate whether to read array data (e.g., data from the memory array 407) or register data (e.g., data from the registers 413). Based on receiving the register address 443 and the indication of the type of command 441, register data 445 may be output from (e.g., read from) the registers 413. The registers 413 may also output signaling 447 indicating that the register data is ready.

In some examples, the circuit 400 may include a second circuit 415, which may be referred to as a register shifter 415. The second circuit 415 may receive the type of command 441 (e.g., an indication that a command is a register read command) and may output second signaling 449. The second signaling 449 may ensure that array data output from the circuit 400 is clocked correctly based on a latency (e.g., a second latency) between the associated memory device receiving a command and data being output from the registers 413. For example, the data may be output from the circuit 400 at a same or a different frequency, but shifted in phase based on the second signaling 449. In some examples, the second signaling 449 may also be provided to the latch 419.

In some examples, the circuit 400 may include a second buffer 417, which may be a FIFO buffer 417. The second buffer 417 may be configured to receive the register data 445, as well as the second signaling 449 (e.g., the signaling from the second circuit 415) and the signaling 447 from the registers 413. In some examples, the signaling 447 may be an input clock signal for the second buffer 417 and the second signaling 449 may be an output clock signal for the second buffer 417. Accordingly, the second buffer 417 may output the register data 445, which may be shifted based on the second signaling 449.

As described herein, the second buffer 417 may be a FIFO buffer 417 where the oldest entry (e.g., the first entry) is processed first and the newest entry (e.g., the last entry) is processed last. Moreover, the second buffer 417 may be associated with a second queue depth and thus may store a quantity (e.g., a second quantity) of data bursts (e.g., register data) during a duration, which may be a different quantity of data bursts than the first buffer 409 is configured to store. For example, the first latency may include a first quantity of clock cycles, and the second queue depth may correspond to a number of times that a command for reading registers 413 may be received during the first quantity of clock cycles. That is, where consecutive commands for reading registers are received during the time duration between receiving a command for reading array data and completion of output of the array data, the second buffer 417 may store the register data 445 for the consecutive commands. In some examples, the second buffer 417 may output the buffered register data 446, which may be received by the multiplexer 421 (e.g., as an input to the multiplexer 421). The second buffer 417 may output the buffered register data 446 sequentially based on activation of the second signaling 449, which may result in buffered register data 446 being output (e.g., via multiplexer 421 and third buffer 423) subsequent to output of the array data. In some cases, the buffered register data 446 may be output in consecutive clock cycles to the array data, and register data associated with multiple read commands to registers 413 may be output sequentially from the second buffer 417.

The latch 419 may be configured to store a value for a control signal 451 based on the first signaling 435 and the second signaling 449 and may provide the control signal 451 to the multiplexer 421. For example, the first signaling 435 may set the latch to output a first logic value (e.g., a high logic value, a logic "1") and the second signaling 449 may reset the latch to output a second logic value (e.g., a low logic value, a logic "0") or vice versa.

The latch 419 may output control signal 451 to the multiplexer 421. If the control signal 451 is the first logic value, the multiplexer 421 may select the input corresponding to the buffered array data 438. In other words the multiplexer 421 may output the buffered array data 438 based on the control signal 451 having a value associated with the first signaling 435 being active. Additionally or alternatively, when the latch 419 outputs the second logic value on control signal 451 to the multiplexer 421, the multiplexer 421 may select the input corresponding to the buffered register data 446. In other words, the multiplexer 421 may output the buffered register data 446 based on the control signal having a value associated with the second signaling 449 being active. The multiplexer 421 may output the buffered array data 438 and the buffered register data 446 (e.g., sequentially) via an output line 453 that is coupled with a third buffer 423.

In some examples, the third buffer 423 may receive the buffered array data 438 and the buffered register data 446 from the multiplexer 421. The third buffer 423 may be included in (or a subcomponent of) an output component 425. The third buffer 423 may be coupled with a DQ channel 459, which may be an example of the DQ channel 303 as described with reference to FIG. 3, and may output the buffered array data 438 and the buffered register data 446 during consecutive sets of clock cycles. In some examples, the third buffer 423 may receive an input clock signal 455 and an output clock signal 457 and may output the buffered array data 438 and the buffered register data 446 according to the clock signals. Thus the circuit 400 may receive commands during consecutive clock cycles and may output corresponding data during consecutive clock cycles. Outputting the data during consecutive sets of clock cycles may reduce or eliminate the quantity of empty clock cycles on the DQ channel 459, which may improve the overall performance of the associated memory device.

Figure 5:
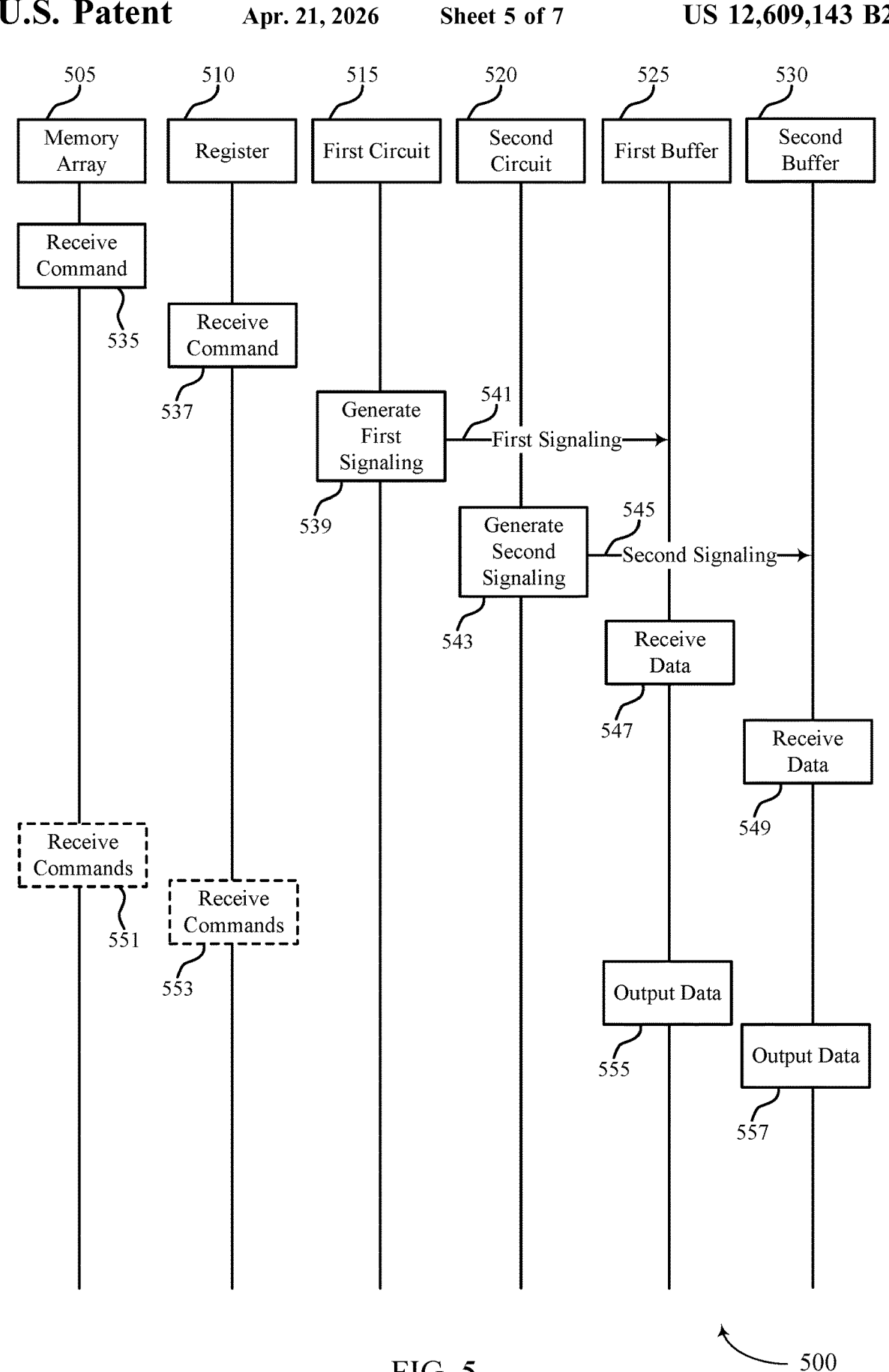
FIG. 5 illustrates an example of a process flow diagram that supports read operations for a memory array and register in accordance with examples as disclosed herein.

FIG. 5 illustrates an example of a process flow diagram 500 that supports read operations for a memory array and register in accordance with examples as disclosed herein. The process flow diagram 500 may illustrate operations that occur at a memory array 505, a register 510, a first circuit 515, a second circuit 520, a first buffer 525, and a second buffer 530. In some examples, the memory array 505, the register 510, the first circuit 515, the second circuit 520, the first buffer 525, and the second buffer 530 may be examples of the memory array 407, the register 413, the first circuit 411, the second circuit 415, the first buffer 409, and the second buffer 417, respective, as described with reference to FIG. 4. The process flow diagram 500 may illustrate receiving commands to read data from the memory array 505 and the register 510 during consecutive sets of clock cycles and outputting corresponding data during consecutive sets of clock cycles which may reduce or eliminate the quantity of empty clock cycles on a DQ channel, which may improve the overall performance of the associated memory device.

At 535, the memory array 505 may receive a command. In some examples, the command may be a read command for data stored at the memory array 505 and may include an address (e.g., an address 429 as described with reference to FIG. 4), a command type (e.g., a command type 431 as described with reference to FIG. 4), and a partition address (e.g., a partition address 433 as described with reference to FIG. 4). The command may be received from a control circuit (e.g., a control circuit 405 as described with reference to FIG. 4) or may be received from a host device. In some examples at 535, although not shown in FIG. 5, the first circuit 515 may also receive the command type and the partition address. The command may be received during a first set of clock cycles as described with reference to FIG. 3.

At 537, the register 510 may receive a command. In some examples, the command may be a read command for data stored at the register 510 and may include a command type (e.g., a command type 441 as described with reference to FIG. 4) and a register address (e.g., a register address 443 as described with reference to FIG. 4). The command may be received from a host device. In some examples at 537, although not shown in FIG. 5, the second circuit 520 may also receive the command type. The command may be received during a second set of clock cycles as described with reference to FIG. 3.

At 539, the first circuit 515 may generate first signaling. The first signaling may be generated based on the first circuit 515 receiving the command type and the partition address (not shown). As described with reference to FIG. 4, the first signaling may ensure that array data output from the associated memory device is clocked correctly based on a latency (e.g., a first latency) between the memory device receiving a command (e.g., at 535) and data being output from the memory array 505. For example, the data may be output from the memory device at a same or a different frequency, but shifted in phase based on the first signaling. At 541, the first circuit 515 may output the first signaling to the first buffer 525. In some examples, the first circuit 515 may also output the first signaling to a latch (not shown).

At 543, the second circuit 520 may generate second signaling. The second signaling may be generated based on the second circuit 520 receiving the command type (not shown). As described with reference to FIG. 4, the second signaling may ensure that register data output from the associated memory device is clocked correctly based on a latency (e.g., a second latency) between the memory device receiving a command (e.g., at 537) and data being output from the register 510. For example, the data may be output from the memory device at a same or a different frequency, but shifted in phase based on the first signaling. At 545, the second circuit 520 may output the second signaling to the second buffer 530. In some examples, the second circuit 520 may also output the first signaling to a latch (not shown). In some examples, although not shown in FIG. 5, at least a portion of steps 539 and 541 and steps 543 and 545 may overlap in duration (e.g., some portions of the steps may occur concurrently).

At 547, the first buffer 525 may receive data read from the memory array 505. The data may be read from the memory array 505 based on the memory array 505 receiving the command (e.g., at 535). The first buffer 525 may also receive signaling from the memory array 505, such as signaling 439 as described with reference to FIG. 4, indicating that the array data is ready. The signaling may be used by the first buffer 525 as an input clock signal and the first signaling may be used by the first buffer 525 as an output clock signal.

At 549, the second buffer 530 may receive data read from the register 510. The data may be read from the register 510 based on the register 510 receiving the command (e.g., at 537). The second buffer 530 may also receive signaling from the register 510, such as signaling 447 as described with reference to FIG. 4, indicating that the register data is ready. The signaling may be used by the second buffer 530 as an input clock signal and the second signaling may be used by the second buffer 530 as an output clock signal. In some examples, the array data may be buffered (e.g., at 547) and the register data may be buffered (e.g., at 549) during an overlapping duration (e.g., at least a portion of the array data and the register data may be buffered concurrently).

At 551, the memory array 505 may receive multiple commands. The commands may be read commands for data stored at the memory array 505 and may each include an address, a command type, and a partition address. The commands may be received while the array data is stored to the first buffer 525. That is, the array data may be buffered by the first buffer 525 while other commands are received by the memory array 505 and associated signaling is generated.

At 553, the register 510 may receive multiple commands. The commands may be read commands for data stored at the register 510 and may each include a command type and a register address. The commands may be received while the register data is stored to the second buffer 530. That is, the register data may be buffered by the second buffer 530 while other commands are received by the register 510 and associated signaling is generated.

At 555, the first buffer 525 may output the array data to a multiplexer (e.g., a multiplexer 421 as described with reference to FIG. 4), which is not shown in FIG. 5. The multiplexer may output the array data to a third buffer (e.g., a third buffer 423 as described with reference to FIG. 4) based on receiving a control signal from a latch. The control signal may be associated with the first signaling. The third buffer may output the array data to a DQ channel during a third set of clock cycles.

At 557, the second buffer 530 may output the register data to the multiplexer (not shown). The multiplexer may output the register data to a third buffer (e.g., a third buffer 423 as described with reference to FIG. 4) based on receiving a control signal from a latch. The control signal may be associated with the second signaling. The third buffer may output the register data to a DQ channel during a fourth set of clock cycles. Outputting the array data and the register data during consecutive sets of clock cycles may reduce or eliminate the quantity of empty clock cycles on the DQ channel, which may improve the overall performance of the associated memory device.

Figure 6:
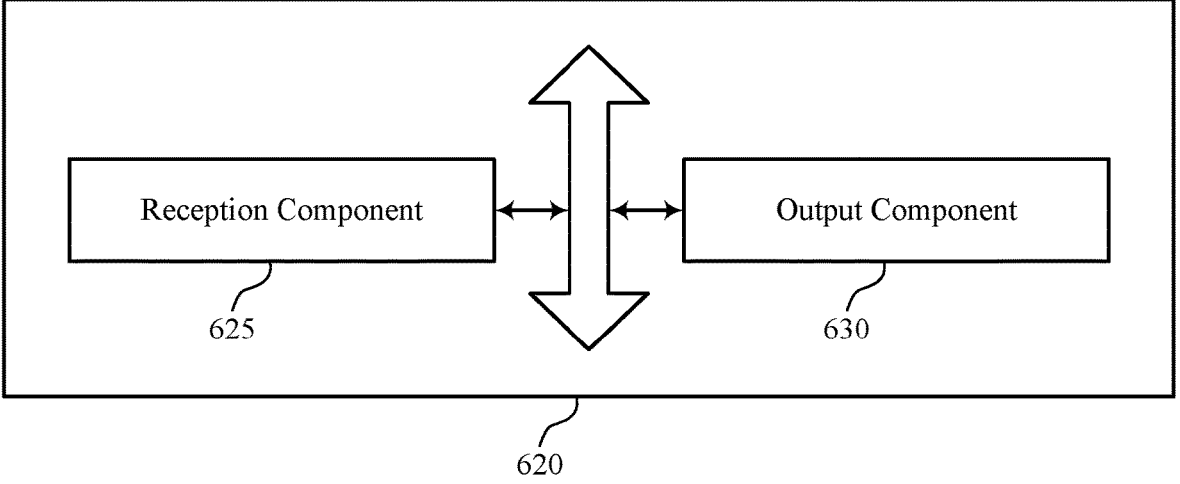
FIG. 6 shows a block diagram of a memory device that supports read operations for a memory array and register in accordance with examples as disclosed herein.

FIG. 6 shows a block diagram 600 of a memory device 620 that supports read operations for a memory array and register in accordance with examples as disclosed herein. The memory device 620 may be an example of aspects of a memory device as described with reference to FIGS. 1 through 5. The memory device 620, or various components thereof, may be an example of means for performing various aspects of read operations for a memory array and register as described herein. For example, the memory device 620 may include a reception component 625 an output component 630, or any combination thereof. Each of these components may communicate, directly or indirectly, with one another (e.g., via one or more buses).

The reception component 625 may be configured as or otherwise support a means for receiving, during a first set of clock cycles, a first command for reading first data of a memory array of a memory device, where the memory device includes the memory array and a register associated with one or more parameters for operation of the memory device. In some examples, the reception component 625 may be configured as or otherwise support a means for receiving a second command for reading second data of the register of the memory device during a second set of clock cycles.

The output component 630 may be configured as or otherwise support a means for outputting the first data from the memory array and the second data from the register via a data bus coupled with the memory array and the register based at least in part on receiving the first command and the second command, where the first data is output from the memory array during a third set of clock cycles and the second data is output from the register during a fourth set of clock cycles, and where a last clock cycle of the third set of clock cycles and a first clock cycle of the fourth set of clock cycles are consecutive clock cycles.

In some examples, a first latency between receiving the first command and outputting the first data is the same as a second latency between receiving the second command and outputting the second data. In some examples, a last clock cycle of the first set of clock cycles and a first clock cycle of the second set of clock cycles are consecutive clock cycles.

In some examples, the first set of clock cycles includes a same quantity of clock cycles as the third set of clock cycles. In some examples, a fifth set of clock cycles occurs between a last clock cycle of the first set of clock cycles and a first clock cycle of the second set of clock cycles.

In some examples, the first set of clock cycles includes a different quantity of clock cycles than the third set of clock cycles. In some examples, the fifth set of clock cycles includes a same quantity of clock cycles as the difference in the quantity between the first set of clock cycles and the third set of clock cycles. In some examples, the second command is received before the first command. In some examples, the first data is output from the memory array before the second data is output from the register.

FIG. 7 shows a flowchart illustrating a method 700 that supports read operations for a memory array and register in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include receiving, during a first set of clock cycles, a first command for reading first data of a memory array of a memory device, where the memory device includes the memory array and a register associated with one or more parameters for operation of the memory device. The operations of 705 may be performed in accordance with examples as disclosed herein. In some examples, aspects of the operations of 705 may be performed by a reception component 625 as described with reference to FIG. 6.

At 710, the method may include receiving a second command for reading second data of the register of the memory device during a second set of clock cycles. The operations of 710 may be performed in accordance with examples as disclosed herein. In some examples, aspects of the operations of 710 may be performed by a reception component 625 as described with reference to FIG. 6.

At 715, the method may include outputting the first data from the memory array and the second data from the register via a data bus coupled with the memory array and the register based at least in part on receiving the first command and the second command, where the first data is output from the memory array during a third set of clock cycles and the second data is output from the register during a fourth set of clock cycles, and where a last clock cycle of the third set of clock cycles and a first clock cycle of the fourth set of clock cycles are consecutive clock cycles. The operations of 715 may be performed in accordance with examples as disclosed herein. In some examples, aspects of the operations of 715 may be performed by an output component 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, during a first set of clock cycles, a first command for reading first data of a memory array of a memory device, where the memory device includes the memory array and a register associated with one or more parameters for operation of the memory device; receiving a second command for reading second data of the register of the memory device during a second set of clock cycles; and outputting the first data from the memory array and the second data from the register via a data bus coupled with the memory array and the register based at least in part on receiving the first command and the second command, where the first data is output from the memory array during a third set of clock cycles and the second data is output from the register during a fourth set of clock cycles, and where a last clock cycle of the third set of clock cycles and a first clock cycle of the fourth set of clock cycles are consecutive clock cycles.

Aspect 2: The method, apparatus, or non-transitory computer-readable medium of aspect 1 where a first latency between receiving the first command and outputting the first data is the same as a second latency between receiving the second command and outputting the second data.

Aspect 3: The method, apparatus, or non-transitory computer-readable medium of any of aspects 1 through 2 where a last clock cycle of the first set of clock cycles and a first clock cycle of the second set of clock cycles are consecutive clock cycles.

Aspect 4: The method, apparatus, or non-transitory computer-readable medium of aspect 3 where the first set of clock cycles includes a same quantity of clock cycles as the third set of clock cycles.

Aspect 5: The method, apparatus, or non-transitory computer-readable medium of any of aspects 1 through 4 where a fifth set of clock cycles occurs between a last clock cycle of the first set of clock cycles and a first clock cycle of the second set of clock cycles.

Aspect 6: The method, apparatus, or non-transitory computer-readable medium of aspect 5 where the first set of clock cycles includes a different quantity of clock cycles than the third set of clock cycles and the fifth set of clock cycles includes a same quantity of clock cycles as the difference in the quantity between the first set of clock cycles and the third set of clock cycles.

Aspect 7: The method, apparatus, or non-transitory computer-readable medium of any of aspects 1 through 6 where the second command is received before the first command and the first data is output from the memory array before the second data is output from the register.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 8: A memory device, including: a memory array including a plurality of memory cells configured to store first data, where the first data is output from the memory array based at least in part on the memory device receiving a first command; a first buffer coupled with the memory array and configured to buffer the first data based at least in part on the first data being output from the memory array; a register configured to store second data, where the second data is output from the register based at least in part on the memory device receiving a second command different than the first command; a second buffer coupled with the register and configured to buffer the second data based at least in part on the second data being output from the register; and a multiplexer coupled with the first buffer, the second buffer, and a data bus, where the multiplexer is configured to output the first data and the second data on the data bus during consecutive sets of clock cycles.

Aspect 9: The memory device of aspect 8, further including: a first circuit coupled with the first buffer and configured to receive the first command and output first signaling to the first buffer, where the first signaling is associated with a first latency between the memory device receiving the first command and reading the first data from the memory array, and where the first buffer is configured to output the first data based at least in part on receiving the first signaling.

Aspect 10: The memory device of aspect 9, further including: a second circuit coupled with the second buffer and configured to receive the second command and output signaling to the second buffer, where the second signaling is associated with a second latency between the memory device receiving the second command and reading the second data from the register, and where the second buffer is configured to output the second data based at least in part on receiving the second signaling.

Aspect 11: The memory device of aspect 10, where a third latency between the memory device receiving the first command and the multiplexer outputting the first data is the same as a fourth latency between the memory device receiving the second command and the multiplexer outputting the second data based at least in part on the first circuit outputting the first signaling and the second circuit outputting the second signaling.

Aspect 12: The memory device of any of aspects 10 through 11, further including: a latch coupled with the first circuit, the second circuit, and the multiplexer, where the latch is configured to output a control signal to the multiplexer based at least in part on receiving the first signaling or the second signaling.

Aspect 13: The memory device of any of aspects 8 through 12, where the first buffer includes a first-in first-out (FIFO) buffer having a first depth and the second buffer includes a FIFO buffer having a second depth different than the first depth, a buffer depth is associated with a quantity of data bursts that a respective buffer can store during a duration.

Aspect 14: The memory device of any of aspects 8 through 13, where the memory device is configured to receive the first command during a first set of clock cycles and receive the second command during a second set of clock cycles, and the multiplexer is configured to output the first data during a third set of clock cycles and output the second data during a fourth set of clock cycles.

Aspect 15: The memory device of aspect 14, where a last clock cycle of the first set of clock cycles and a first clock cycle of the second set of clock cycles are consecutive clock cycles.

Aspect 16: The memory device of aspect 15, where a last clock cycle of the third set of clock cycles and a first clock cycle of the fourth set of clock cycles are consecutive clock cycles, and the first set of clock cycles includes a same quantity of clock cycles as the third set of clock cycles.

Aspect 17: The memory device of any of aspects 14 through 16, where a fifth set of clock cycles occurs between a last clock cycle of the first set of clock cycles and a first clock cycle of the second set of clock cycles.

Aspect 18: The memory device of aspect 17, where the first set of clock cycles includes a different quantity of clock cycles than the third set of clock cycles, and the fifth set of clock cycles includes a same quantity of clock cycles as the difference in the quantity between the first set of clock cycles and the third set of clock cycles.

Aspect 19: The memory device of any of aspects 8 through 18, where the second command is received by the memory device before the first command, and the multiplexer is configured to output the first data before outputting the second data.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic
device, discrete gate or transistor logic, discrete hardware
components, or any combination thereof designed to per-
form the functions described herein. A general-purpose
processor may be a microprocessor, but in the alternative,
the processor may be any processor, controller, microcon-
troller, or state machine. A processor may also be imple-
mented as a combination of computing devices (e.g., a
combination of a DSP and a microprocessor, multiple micro-
processors, one or more microprocessors in conjunction
with a DSP core, or any other such configuration).

As used herein, including in the claims, "or" as used in a
list of items (for example, a list of items prefaced by a phrase
such as "at least one of" or "one or more of") indicates an
inclusive list such that, for example, a list of at least one of
A, B, or C means A or B or C or AB or AC or BC or ABC
(i.e., A and B and C). Also, as used herein, the phrase "based
on" shall not be construed as a reference to a closed set of
conditions. For example, an exemplary step that is described
as "based on condition A" may be based on both a condition
A and a condition B without departing from the scope of the
present disclosure. In other words, as used herein, the phrase
"based on" shall be construed in the same manner as the
phrase "based at least in part on."

Computer-readable media includes both non-transitory
computer storage media and communication media includ-
ing any medium that facilitates transfer of a computer
program from one place to another. A non-transitory storage
medium may be any available medium that can be accessed
by a general purpose or special purpose computer. By way
of example, and not limitation, non-transitory computer-
readable media can comprise RAM, ROM, electrically eras-
able programmable read-only memory (EEPROM), com-
pact disk (CD) ROM or other optical disk storage, magnetic
disk storage or other magnetic storage devices, or any other
non-transitory medium that can be used to carry or store
desired program code means in the form of instructions or
data structures and that can be accessed by a general-
purpose or special-purpose computer, or a general-purpose
or special-purpose processor. Also, any connection is properly termed a computer-readable medium. For example, if
the software is transmitted from a website, server, or other
remote source using a coaxial cable, fiber optic cable,
twisted pair, digital subscriber line (DSL), or wireless tech-
nologies such as infrared, radio, and microwave, then the
coaxial cable, fiber optic cable, twisted pair, digital sub-
scriber line (DSL), or wireless technologies such as infrared,
radio, and microwave are included in the definition of
medium. Disk and disc, as used herein, include CD, laser
disc, optical disc, digital versatile disc (DVD), floppy disk
and Blu-ray disc where disks usually reproduce data mag-
netically, while discs reproduce data optically with lasers.
Combinations of the above are also included within the
scope of computer-readable media.

The description herein is provided to enable a person
skilled in the art to make or use the disclosure. Various
modifications to the disclosure will be apparent to those
skilled in the art, and the generic principles defined herein
may be applied to other variations without departing from
the scope of the disclosure. Thus, the disclosure is not
limited to the examples and designs described herein, but is
to be accorded the broadest scope consistent with the
principles and novel features disclosed herein.

What is claimed is:

1. A memory device, comprising:
a memory array comprising a plurality of memory cells
configured to store first data, wherein the first data is output from the memory array based at least in part on
the memory device receiving a first command;
a register configured to store second data, wherein the
second data is output from the register based at least in
part on the memory device receiving a second com-
mand, wherein the first command and the second
command are during first consecutive clock cycles; and
a multiplexer coupled with the memory array, the register,
and a data bus, wherein the multiplexer is configured to
output the first data and the second data on the data bus
during second consecutive sets of clock cycles.

2. The memory device of claim 1, further comprising:
a first circuit coupled with the multiplexer and configured
to receive the first command and output first signaling,
wherein the first signaling is associated with a first
latency between the memory device receiving the first
command and reading the first data from the memory
array, and wherein the multiplexer is configured to
output the first data based at least in part on the first
circuit outputting the first signaling.

3. The memory device of claim 2, further comprising:
a second circuit coupled with the multiplexer and config-
ured to receive the second command and output second
signaling, wherein the second signaling is associated
with a second latency between the memory device
receiving the second command and reading the second
data from the register, and wherein the multiplexer is
configured to output the second data based at least in
part on the second circuit outputting the second signal-
ing.

4. The memory device of claim 1, wherein:
the register is configured to store third data and output the
third data based at least in part on the memory device
receiving a third command during a third set of clock
cycles,
the memory array is configured to store fourth data and
output the fourth data based at least in part on the
memory device receiving a fourth command during a
fourth set of clock cycles, and
a fifth set of clock cycles occur between the fourth set of
clock cycles and the third set of clock cycles.

5. The memory device of claim 4, wherein the multiplexer
is configured to output the fourth data and the third data
during a third set of consecutive sets of clock cycles, and
wherein the fourth data is output prior to the third data.

6. The memory device of claim 5, wherein a third latency
between receiving the third command and outputting the
third data is greater than a second latency between receiving
the fourth command and outputting the fourth data.

7. The memory device of claim 3, further comprising:
a latch coupled with the first circuit, the second circuit,
and the multiplexer, wherein the latch is configured to
output a control signal to the multiplexer based at least
in part on receiving the first signaling or the second
signaling.

8. The memory device of claim 1, wherein:
the second command is received by the memory device
before the first command; and
the multiplexer is configured to output the first data before
outputting the second data.

9. A method, comprising:
receiving, during a first set of clock cycles, a first com-
mand for reading first data of a memory array of a
memory device, wherein the memory device comprises
the memory array and a register associated with one or
more parameters for operation of the memory device, and wherein the memory device is associated with a first latency between receiving the first command and reading the first data;

receiving a second command for reading second data of the register of the memory device during a second set of clock cycles, the second set of clock cycles consecutive with the first set of clock cycles, wherein the memory device is associated with a second latency between receiving the second command and reading the second data; and outputting the first data from the memory array and the second data from the register via a data bus coupled with the memory array and the register based at least in part on receiving the first command and the second command, wherein the first data is output from the memory array during a third set of clock cycles and the second data is output from the register during a fourth set of clock cycles, and wherein a last clock cycle of the third set of clock cycles and a first clock cycle of the fourth set of clock cycles are consecutive clock cycles.

10. The method of claim 9, further comprising:

receiving, during the third set of clock cycles, a third command for reading third data of the register; and receiving, during the fourth set of clock cycles, a fourth command for reading fourth data of the memory array, wherein a fifth set of clock cycles occur between the fourth set of clock cycles and the third set of clock cycles.

11. The method of claim 10, further comprising:

outputting the fourth data and the third data during a third set of consecutive sets of clock cycles, wherein fourth data is output prior to the third data.

12. The method of claim 11, wherein a third latency between receiving the third command and outputting the third data is greater than a fourth latency between receiving the fourth command and outputting the fourth data.

13. The method of claim 9, wherein:

the second command is received before the first command; and the first data is output from the memory array before the second data is output from the register.

14. A memory device comprising:

a memory array comprising a plurality of memory cells configured to store first data, wherein the first data is output from the memory array based at least in part on the memory device receiving a first command;

a first buffer coupled with the memory array and configured to buffer the first data based at least in part on the first data being output from the memory array, wherein the first buffer comprises a first-in first-out (FIFO) buffer;

a register configured to store second data, wherein the second data is output from the register based at least in part on the memory device receiving a second command different than the first command;

a second buffer coupled with the register and configured to buffer the second data based at least in part on the second data being output from the register, the second buffer comprising a FIFO buffer; and a multiplexer coupled with the first buffer, the second buffer, and a data bus, wherein the multiplexer is configured to output the first data and the second data on the data bus during consecutive sets of clock cycles.

15. The memory device of claim 14, wherein the second buffer comprises a queue depth corresponding to a quantity of data bursts that the second buffer can store during a duration, the queue depth based at least in part on a threshold quantity of commands that can be received during a first latency between the memory device receiving the first command and the multiplexer outputting the first data.

16. The memory device of claim 14, further comprising:

a first circuit coupled with the multiplexer and configured to receive the first command and output first signaling, wherein the first signaling is associated with a first latency between the memory device receiving the first command and reading the first data from the memory array, and wherein the multiplexer is configured to output the first data based at least in part on the first circuit outputting the first signaling.

17. The memory device of claim 16, further comprising:

a second circuit coupled with the multiplexer and configured to receive the second command and output second signaling, wherein the second signaling is associated with a second latency between the memory device receiving the second command and reading the second data from the register, and wherein the second buffer is configured to output the second data based at least in part on the second circuit outputting the second signaling.

18. The memory device of claim 14, wherein:

the register is configured to store third data and output the third data based at least in part on the memory device receiving a third command during a third set of clock cycles, the memory array is configured to store fourth data and output the fourth data based at least in part on the memory device receiving a fourth command during a fourth set of clock cycles, and a fifth set of clock cycles occur between the fourth set of clock cycles and the third set of clock cycles.

19. The memory device of claim 18, wherein the multiplexer is configured to output the fourth data and the third data during a third set of consecutive sets of clock cycles, and wherein the fourth data is output prior to the third data.

20. The memory device of claim 19, wherein a third latency between receiving the third command and outputting the third data is greater than a second latency between receiving the fourth command and outputting the fourth data.

* * * * *